United States Patent [19]

Agnihotri et al.

[11] 4,092,442
[45] May 30, 1978

[54] METHOD OF DEPOSITING THIN FILMS UTILIZING A POLYIMIDE MASK

[75] Inventors: Ram Kumar Agnihotri, Wappingers Falls; Herman Carl Kluge, II, Fishkill, both of N.Y.

[73] Assignee: International Business Machines Corporation, Armonk, N.Y.

[21] Appl. No.: 755,877

[22] Filed: Dec. 30, 1976

[51] Int. Cl.² .............................................. B05D 3/06
[52] U.S. Cl. ...................................... 427/41; 156/643; 156/659; 156/661; 427/43; 96/35.1; 96/36.2
[58] Field of Search ............... 156/643, 659, 661, 668, 156/901; 204/192; 427/38, 41, 43, 96; 96/35.1, 36.2

[56] References Cited

U.S. PATENT DOCUMENTS

| | | | |
|---|---|---|---|
| 3,700,497 | 10/1972 | Epifano et al. | 156/659 X |
| 3,705,055 | 12/1972 | Christensen et al. | 427/38 |
| 3,767,490 | 10/1973 | Alberts | 156/668 X |
| 3,853,813 | 12/1974 | Edelman et al. | 427/388 R X |
| 3,914,127 | 10/1975 | Buss et al. | 156/643 X |
| 4,004,044 | 1/1977 | Franco et al. | 156/659 X |

*Primary Examiner*—John H. Newsome
*Attorney, Agent, or Firm*—Thomas F. Galvin

[57] ABSTRACT

A polyimide mask is used as an undercoat for a standard resist material during the patterning of an underlying thin film layer by plasma etching. The polyimide mask can withstand the conditions of reactive ion (plasma) etching so that it can be used as a protective coating when the thin film is subtractively etched by the plasma etching. The polyimide is particularly useful in processes using either positive or negative electron beam lithography which require sensitive resists.

9 Claims, 7 Drawing Figures

METHOD OF DEPOSITING THIN FILMS UTILIZING A POLYIMIDE MASK

BACKGROUND OF THE INVENTION

This invention relates to a method of depositing thin film particularly metallic or dielectric films in the fabrication of integrated circuits.

At present in the semiconductor industry the formation of thin film patterns atop semiconductor substrates is accomplished primarily by etching in the presence of etch-resistant photoresist layers. The process involves the traditional photolithographic wetetching of both the thin film as well as the photoresist layers.

These relatively old and well-known techniques have been eminently successful. However, with the continued miniturization of semiconductor integrated circuits to achieve greater component density and smaller units of large scale integrated circuitry, the art is rapidly approaching a point where either optical processing or wet etching or both may be impractical for providing the minute resolution required for the fine line definition of metallization.

Wet etching of thin films may be used in either electron beam or optical exposure systems. However, it often results in the contamination of the metal, primarily due to particles within the etching solution itself. In addition to the purity and composition of the etchant, the duration of the etching must be carefully controlled to prevent under or over-etching of the thin film. Plasma, or reactive ion, etching has in relatively recent times come to be recognized as a practical alternative to wet etching. Contamination may be less of a problem and the etching equipment assures adequate process control for the most precise thin film patterns.

One of the problems associated with plasma etching of thin films, however, is that most of the well-known and commonly used optical-and electron beam-resist materials cannot withstand the processing intact. The resists tend to flow during the etching process apparently because of their reactions with the gaseous ions and the temperature of the semiconductor substrate, typically around 200° C or more. Thus, it would be desirable to be able to plasma etch a single photoresist material such as polymethylmethacrylate (PMMA) directly over a metallic thin film to define the desired conductive pattern. The resist would then be used as a mask and the exposed metal etched away, typically by another gas which attacks the metal but not the photoresist. The remaining photoresist would then be removed in the conventional manner to leave the desired thin film pattern.

To our knowledge there is no practical way to accomplish this single-coat technique of plasma etching thin films. A number of different resist materials and reactive gases have been tried, but with little success.

This problem exists with materials which are both optically and electron sensitive such as AZ-1350J, a positive resist available from the Shipley Corp. The same holds for negative resist materials which are electron or optically sensitive, such as KTFR or KMER which are available from the Eastman Kodak Corporation.

The problem is particularly acute with highly sensitive resist materials such as PMMA, which is an excellent electronsensitive material. It has been recognized for many years that electron beam sytems would be more advantageous than optical systems for the exposure of photoresist layers. Electron beam systems offer greater resolution and power density then optical systems; and electron beams can be deflected electrically. Until recently, the use of electron beam systems has been inhibited by the lack of high quality resist material and the development and tooling cost of adequate electron beam systems. However, it appears that electron beam techniques are on the verge of substantially replacing optical systems. It is therefore highly desirable to develop an E-beam resist system which is compatable with plasma etching.

SUMMARY OF THE INVENTION

Accordingly, it is a primary object of our invention to provide an improved method for depositing thin film patterns atop substrates.

It is another object of our invention to achieve a practical method of etching thin film patterns in a plasma.

It is yet another object of our invention to perform such plasma etching while using sensitive resist materials for defining said thin film patterns.

We have found that a polyimide mask can withstand the conditions of reactive ion etching, which conditions cause all other common resist materials such as PMMA, PMMA/MAA, KTFR, KMER and uncrosslinked AZ-1350 to disintegrate. This property is used in the fabrication of thin film patterns by depositing the polyimide layer atop the thin film layer or layers, followed by the application of the resist layer. Both the resist and polyimide layers are exposed. The resist is developed, and the polyimide is etched, thereby exposing portions of the underlying thin film layer. The exposed portions of the thin film are then etched in a plasma gas. The action of the plasma gas also removes the remaining resist layer. The polyimide layer protects the unexposed thin film from attack by the plasma gas.

The term polyimide also includes polyamide-imide compounds.

DESCRIPTION OF THE PREFERRED EMBODIMENT

By reference to FIGS. 1A–1G there will now be described the preferred method of the present invention.

The structure in these figures is a portion of an integrated circuit chip which may be formed in any of the conventional integrated circuit fabrication techniques. In our preferred embodiment, substrate 2 is typically an insulator such as silicon dioxide, silicon nitride or a composite of silicon dioxide and silicon nitride. In the usual process the substrate is disposed atop a silicon semiconductor body (not shown). Openings, not illustrated, are provided to contact regions in underlying semiconductor layer to the conductor patterns formed on the surface of substrate 2. For purposes of clarity and conciseness, FIGS. 1A–1G which illustrate the preferred embodiment of the process, omit illustration of the silicon semiconductor body as well as the contact openings in insulating layer 2.

Although our preferred embodiment contemplates the formation of a thin film pattern which is connected to regions within a semiconductor body, our process is also applicable to multiple levels of metallization. For example, our process may be used to form second and- /or third levels of metallization atop a semiconductor.

Deposited atop substrate 2 is a thin film 4 which is to be patterned. In our preferred embodiment, thin film 4 may be any metal which is conventionally used for integrated circuit metallization, e.g., aluminum, aluminumcopper-silicon alloys, platinum, palladium, chrome or molybdenum. In addition, tantalum or alloys of titaniumtungsten are suitable. Alternatively, thin film 4 may be a dielectric material such as silicon nitride or silicon dioxide. Moreover, thin film 4 may be a composite layer of a dielectric material and metal. The thin film is deposited in conventional fashion and typically has a thickness in the order of one micrometer.

Figure 1A:
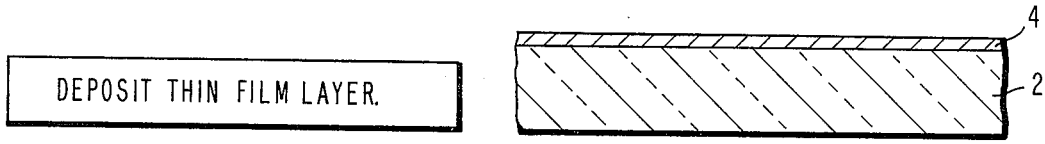
FIGS. 1A–1G, are diagrammatic, cross-sectional views of a structure being fabricated in accordance with the preferred embodiments of the present invention. The figures also include a flow chart describing each of the steps.
Figure 1B:
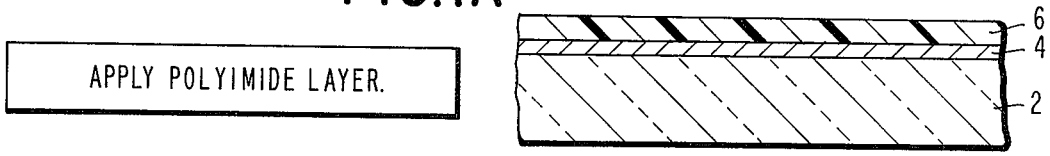
Figure 1C:
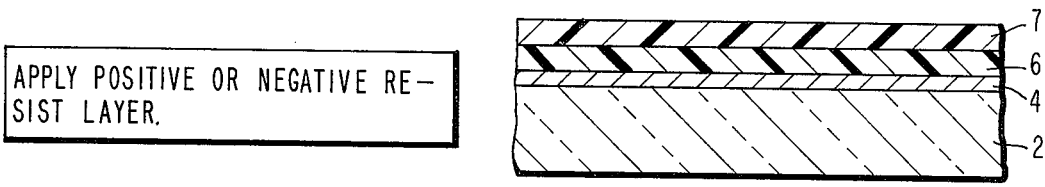

Turning now to FIG. 1B, a polyimide layer 6 preferably having a thickness of from 1.2 to 2.5 micrometers is deposited atop thin film 4. Suitable polyimides may be formed from a number of commercially available polyamic acid compounds. The preferred compound is a polyamic acid which is marketed by Amoco Corp. under the name of AI 10. This polyamic acid has the structural formula:

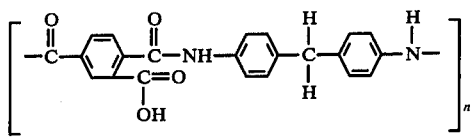

After deposition atop thin film 4, the acid is then baked at 110°–160° C for 5–15 minutes which converts it to the partially-cured polyamide-imide:

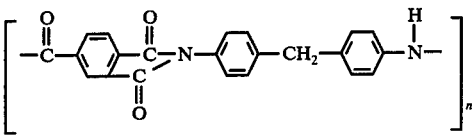

In addition to the aforementioned compound, we have successfully used in our novel process polyamic acids marketed by Monsanto Corp. (Skybond 703), DuPont Corp. (Pyre-M. L.), Ciba-Geigy Corp. (P 13-N), Rhodia Corp. (Nolimid 605, Kerimid 601) and Upjohn Corp. (2820).

It is not necessary for the practice of our process that the polyimide be fully cured. Partially-cured polyimides yield excellent results and are also easier to remove by a wet etchant, when this is called for. However, fully-cured polyimide is also effective.

Next a layer of photoresist 7 is applied over the polyimide layer 6. This may be any conventional optical or electron resist but is preferably a resist which may be exposed by an electron beam such as AZ-1350J, KTFR and PMMA. This resist is applied to a thickness of around one-half to one and one-half microns and baked in conventional fashion. In the case of PMMA it is baked at 160° C for 30 minutes to improve adhesion. The PMMA is then exposed selectively in an electron beam system to form a desired positive pattern.

In addition to PMMA, which is a positive electron resist material, our novel process may be performed with any number of sensitive electron or optical resists which either disintegrate or degrade severely under the condition of plasma etching. For example, the positive resists marketed by the Shipley Company, under the names of AZ 1350H, AZ 1350J and AZ 111 and the negative resists marketed by the Hunt Chemical Company, known as Waycoat IC, and by the Eastman Kodak Co., under the names of KTFR, KMER, KPR-2, and KPR-3 may be used. The techniques for applying, exposing and developing these resists either by electron beam or U.V. light are wellknown to those of skill in the art.

Figure 1D:
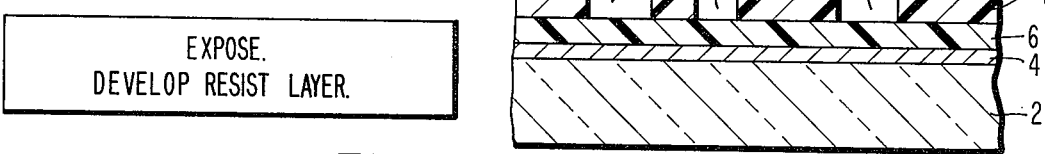

Returning now to the preferred process, after exposure is complete, PMMA resist 7 is developed with a dilute organic or inorganic base solution. This process removes portions of the PMMA which were exposed to the E-Beam, as illustrated in FIG. 1D.

Portions of polyimide layer 6 are thereby exposed through window 8 in layer 7. Layer 6 is then etched, typically with either ethylenediamine, AZ developers, NaOH solution of KOH solution. It may be more advantageous to plasma-etch the polyimide layer in a sputtering chamber using an oxygen gas ambient. We have found that dry plasma etching will remove cured polyimides more easily than the aforementioned wet etchants. However, for partially-cured polyimides, dry or wet etching processes are equivalent.

Figure 1E:
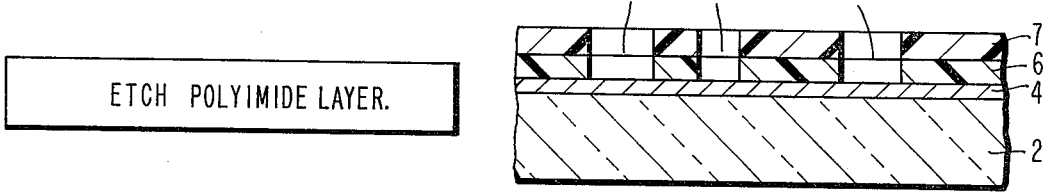

When this step has been completed, windows 9 are opened to the thin film pattern 4, as illustrated in FIG. 1E.

The structure is then subjected to a dry plasma etching process using a reactive gas which etches the exposed portions of metal 4 and also causes the remainder of photoresist 7 to be etched away. The reactive gas is preferably $CCl_4$, which attacks conventional metallic films such as those hereinbefore enumerated but which we have found attack polyimides substantially less. Other gases which may be used include HCl, $Cl_2$, HBr, $Br_2$ and trichloroethylene. Freons of chlorohalogens such as $FCCl_3$, $F_2CCl_2$, as well as FCl, FOCl, etc. are also effective.

Figure 1F:
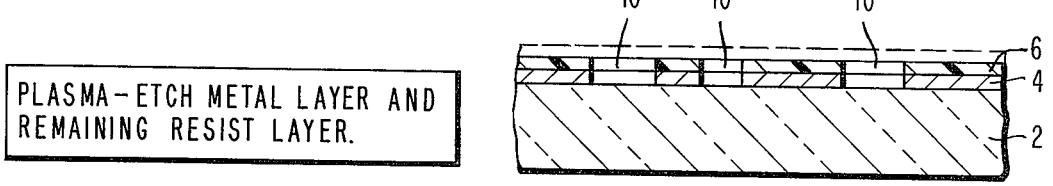

Due to the plasma etching step, thin film layer 4 is patterned in the desired fashion as shown in FIG. 1F. A portion of polyimide layer 6 is also removed but in insufficient quantity to affect its masking properties.

Figure 1G:
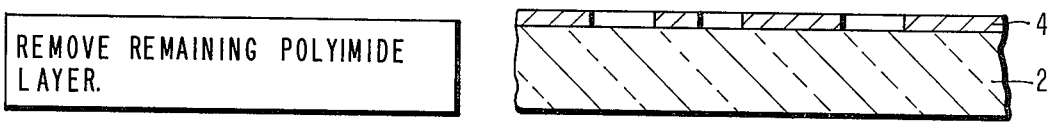

The remainder of polyimide layer 6 is then removed, typically in the same chamber and using oxygen, or DS-300, a commercially available gas mixture, to leave only the desired thin film pattern on substrate 2, as shown in FIG. 1G. Alternatively, it may be removed by immersion in a solvent such as ethylenediamine, or in another basic solution such as NAOH or KOH.

Although our discussion thus far has concerned the etching of metallic thin films, our novel process is also effective for etching dielectrics or composite layers of dielectrics and metals. For example, if thin film 4 were silicon dioxide or silicon nitride instead of a metal, a mixture of $CF_4$ and $O_2$ gas could be used to etch the oxide using the polyimide as a mask. Also suitable is the commercially available gas mixture known as DE 100, which is marketed by the L. F. E. Corp.

In similar fashion composite dielectric/metal films may be etched in a desired pattern.

ALTERNATIVE METHOD

During electron beam exposure of PMMA, a residue or scum may form in openings 8 atop layer 6 (FIG. 1D). This scum may be removed by ashing (plasma etching) the developed resist layer 7 in oxygen gas; this also tends to attack the exposed polyimide. To prevent this, it is advantageous to apply a coat of resin glass atop polyimide 6 prior to the application of resist 7. A 1500-2000A coating of polydimethylsiloxane resin having a preponderance of Si—O bonds relative to Si—CH$_3$ bonds is suitable. Said resin has been described as a protective layer in a lift-off process in copending patent application Ser. No. 576,054, filed May 9, 1975 in the names of J. R. Franco et al. and assigned to the assignee of the present application now U.S. Pat. No. 4,004,044. Said application is hereby incorporated by reference into this application.

In this alternative method, photoresist 7 is exposed and developed as usual and any scum is removed by ashing in oxygen. The resin glass is relatively unaffected and serves to protect the underlying polyimide. After the ashing step, the exposed resin glass is removed by plasma etching in either fluorine gas or in DE 100. This latter is a fluorine-containing gas mixture.

The desired portions of polyimide layer 6 are thereby exposed as in FIG. 1D. The remaining steps are the same as the preferred embodiment previously described, with the resin glass disintegrating when thin film layer 4 is plasma etched (FIG. 1F).

Although the invention has been particularly shown and described with reference to the preferred embodiments thereof, it will be understood by those skilled in the art that the foregoing and other changes in form and details may be made therein without departing from the spirit and scope of the invention.

We claim:

1. A method of forming a patterned thin film on a substrate comprising:
   depositing said thin film onto said substrate;
   forming on said thin film a polyimide layer;
   forming a resist layer on said polyimide layer;
   forming openings through said resist and polyimide layers extending to said thin film, thereby exposing selected portions of said thin film; and
   removing the exposed thin film by plasma etching, using said polyimide as a mask, whereby the remaining thin film is in the desired pattern.

2. A method as in claim 1 further comprising the step of:
   removing the remaining portions of said polyimide layer by etching.

3. A method as in claim 2 wherein said polyimide removing step is conducted by plasma etching with a gas to which said thin film material is insensitive.

4. A method as in claim 1 wherein said thin film is a metal.

5. A method as in claim 1 wherein said thin film is a dielectric.

6. A method as in claim 1 wherein the step of forming openings in said polyimide layer is accomplished by plasma etching.

7. A method as in claim 1 further comprising the steps of:
   prior to forming said resist layer, forming on said polyimide layer a layer of polydimethylsiloxane resin material having a preponderance of Si—O bonds relative to the number of Si—O bonds; and
   after developing said resist layer, forming conformal openings in said resin by plasma etching.

8. A method as in claim 7 further comprising;
   ashing residue from said openings in said resist layer prior to plasma etching said resin, whereby said resin serves as a protective layer to the underlying polyimide.

9. a method of making a patterned thin film on a semiconductor substrate comprising:
   covering at least a portion of said substrate with a dielectric material;
   depositing a film of metal on said dielectric material;
   covering said metal film with a polyamic acid;
   at least partially curing said polyamic acid to form an at least partially-cured polyimide;
   covering said polyimide with a layer of photoresist;
   exposing said photoresist with a masking pattern which defines a desired thin film pattern;
   removing said photoresist and underlying polyimide to expose portions of said metal;
   removing said exposed metal portions by plasma etching using the remaining polyimide as a mask, whereby the remaining metal is in said desired pattern.

* * * * *

UNITED STATES PATENT AND TRADEMARK OFFICE
CERTIFICATE OF CORRECTION

PATENT NO. : 4,092,442
DATED : May 30, 1978
INVENTOR(S) : R. K. Agnihotri et al

It is certified that error appears in the above-identified patent and that said Letters Patent are hereby corrected as shown below:

In Claim 7

Column 6, Line 20    Delete "Si-O" and substitute therefor --Si-$CH_3$--.

Signed and Sealed this

Thirteenth Day of March 1979

[SEAL]

Attest:

RUTH C. MASON
Attesting Officer

DONALD W. BANNER
Commissioner of Patents and Trademarks